United States Patent
Iwai et al.

(10) Patent No.: US 8,568,532 B2
(45) Date of Patent: Oct. 29, 2013

(54) METHOD FOR GROWING SINGLE CRYSTAL OF GROUP III METAL NITRIDE AND REACTION VESSEL FOR USE IN SAME

(75) Inventors: Makoto Iwai, Kasugai (JP); Shuhei Higashihara, Nagoya (JP); Yusuke Mori, Katano (JP); Yasuo Kitaoka, Ibaraki (JP); Naoya Miyoshi, Suita (JP)

(73) Assignees: NGK Insulators, Ltd., Aichi-prefecture (JP); Yusuke Mori, Osaka (JP); Yasuo Kitaoka, Osaka (JP); Naoya Miyoshi, Osaka (JP)

( * ) Notice: Subject to any disclaimer, the term of this patent is extended or adjusted under 35 U.S.C. 154(b) by 0 days.

(21) Appl. No.: 13/315,871

(22) Filed: Dec. 9, 2011

(65) Prior Publication Data

US 2012/0137961 A1    Jun. 7, 2012

Related U.S. Application Data

(63) Continuation of application No. PCT/JP2010/060255, filed on Jun. 10, 2010.

(30) Foreign Application Priority Data

Jun. 11, 2009    (JP) .................................. 2009-139957

(51) Int. Cl.
    *C30B 19/06*    (2006.01)
(52) U.S. Cl.
    USPC ............. 117/206; 117/77; 117/200; 117/204; 117/224; 220/581; 220/582; 220/583; 220/584; 220/585; 220/586; 220/587
(58) Field of Classification Search
    USPC ................... 117/200, 204, 206, 224, 952, 77; 220/581–587
    See application file for complete search history.

(56) References Cited

U.S. PATENT DOCUMENTS 2,280,501 A * 4/1942 Stephenson ................... 220/586
5,251,776 A * 10/1993 Morgan et al. ................ 220/360

(Continued)

FOREIGN PATENT DOCUMENTS

| JP | 2002-326897 A | 11/2002 |
| JP | 2003-313099 A | 11/2003 |
| JP | 2005-263572 A | 9/2005 |
| JP | 2009-91219 A | 4/2009 |

(Continued)

OTHER PUBLICATIONS

International Search Report for PCT Patent App. No. PCT/JP2010/060255 (Aug. 10, 2010).

*Primary Examiner* — Michael Kornakov
*Assistant Examiner* — Kenneth A Bratland, Jr.
(74) *Attorney, Agent, or Firm* — Cermak Nakajima LLP; Tomoko Nakajima

(57) ABSTRACT

Materials of a nitride single crystal of a metal belonging to III group and a flux are contained in a crucible, which is contained in a reaction container, the reaction container is contained in an outer container, the outer container is contained in a pressure container, and nitrogen-containing atmosphere is supplied into the outer container and melt is generated in the crucible to grow a nitride single crystal of a metal belonging to III group. The reaction container includes a main body containing the crucible and a lid. The main body includes a side wall having a fitting face and a groove opening at the fitting face and a bottom wall. The lid has an upper plate part including a contact face for the fitting face of the main body and a flange part extending from the upper plate part and surrounding an outer side of said side wall.

22 Claims, 10 Drawing Sheets

(56) References Cited

U.S. PATENT DOCUMENTS

| | | |
|---|---|---|
| 2003/0164138 A1 | 9/2003 | Sarayama et al. |
| 2008/0282971 A1 | 11/2008 | Iwai et al. |
| 2009/0000542 A1* | 1/2009 | Iwai et al. .................. 117/206 |
| 2009/0013924 A1* | 1/2009 | Iwai et al. .................. 117/64 |

FOREIGN PATENT DOCUMENTS

| | | |
|---|---|---|
| WO | WO2006/098458 A1 | 9/2006 |
| WO | WO2007/108338 A1 | 9/2007 |
| WO | WO2007/108498 A1 | 9/2007 |
| WO | WO2007/122949 A1 | 11/2007 |

* cited by examiner

METHOD FOR GROWING SINGLE CRYSTAL OF GROUP III METAL NITRIDE AND REACTION VESSEL FOR USE IN SAME

This application is a Continuation under 35 U.S.C. §120 of PCT Patent Application No. PCT/JP2010/060255, filed on Jun. 10, 2010, which claims priority under 35 U.S.C. §119 to Japanese Patent Application No. 2009-139957, filed Jun. 11, 2009, both of which are incorporated by reference.

FIELD OF THE INVENTION

The present invention relates to a method of growing a single crystal of a nitride of a metal belonging to group III of periodic table and a reaction container used therefor.

BACKGROUND ARTS

Gallium nitride-based III-V nitride, which is attracting attention as an excellent blue light emitting element, is put into practical use in light emitting diode field, and expected also as a light pick-up blue-violet semiconductor laser device.

According to Japanese Patent Publication No. 2003-313099A, a heater is provided in a pressure container, a separate reaction container is provided inside of the pressure container, and a crucible is provided inside of the reaction container so that a nitride single crystal is grown by means of flux method.

According to WO 2007-108338A1, in growing GaN single crystal using Na flux, flux and raw material are melted in a crucible to grow GaN signel crystal while it is provided a material absorbing oxygen, such as carbon, outside of the crucible. Oxygen generated from a heater or the like in a pressure container is thereby absorbed to prevent the dissolving of the oxygen into melt.

According to the disclosure of WO 2006-098458A1, a lid is provided in a crucible for containing Na and Ga, and a through hole is formed in the lid and sealed with a material softening at a temperature for the growth. Na and Ga materials in the crucible is not oxidized when the materials are weighed and the crucible is moved, and the material sealing the through hole of the lid is softened and the through hole is opened during the growth. Nitrogen in the atmosphere can be thereby supplied into the inside of the container.

According to the disclosure of WO 2007-108498A1, a heating container is provided in a pressure container, and a heater is provided on the inner wall of the heating container. An inner reaction container is then provided in the heating container and a crucible is provided in the inner reaction container, so that a nitride single crystal of a metal belonging to III group of the periodic table is grown in the crucible. A fitting face is formed between a lid and main body of the heating container and inclined to prevent leakage of hot atmosphere inside of the heating container along the fitting face between the lid and container main body. It is thus possible to reduce temperature gradient in the inner container even under the high pressure and temperature condition required for the growth of the nitride single crystal.

DISCLOSURE OF THE INVENTION

However, as a nitride single crystal of a metal belonging to III group of the Periodic Table is actually produced, it is found that the single crystal may be colored even when it is prevented the oxidation of Na or the like during the weighing and moving of the materials. As a result of extensive study of the cause, it is proved that the single crystal may be colored by the inclusion of a trace amount of oxygen and an impurity into the crucible from the atmosphere during the growth. In the case that it is provided a material for absorbing oxygen such as carbon or steel wool in the outside of the crucible, impurities are generated from the oxygen absorbing material, so that it is difficult to prevent the coloration due to the inclusion of impurities during the growth.

In the other hand, it may be considered to improve the confinement of the crucible for preventing the inclusion of impurities during the growth. In this case, however, the amount of supplied nitrogen to the surface of the melt is decreased so that the growth rate of the nitride single crystal is considerably lowered and the reaction container is deformed due to the pressure. Its mass production may become thereby impossible.

An object of the present invention is to prevent the coloration of a single crystal due to trace amounts of oxygen and impurities and the deformation of a reaction container during the growth of the single crystal by means of flux method.

The present invention provides a method of growing a nitride single crystal of a metal belonging to the III group, the method comprising:

containing raw materials of a nitride single crystal of a metal belonging to the III group and a flux in a crucible;
containing the crucible in a reaction container;
containing the reaction container in an outer container;
containing the outer container in a pressure container; and
generating a melt in the crucible while supplying an atmosphere containing nitrogen into the outer container to grow the nitride single crystal of a metal belonging to the III group. The reaction container comprises a main body containing the crucible and a lid mounted on the main body, the main body comprises a bottom wall and a side wall comprising a fitting face and a groove opening at the fitting face, and the lid comprises an upper plate part comprising a contact face contacting the fitting face and a flange part extending from the upper plate part and surrounding an outer side of the side wall.

According to the present invention, the fitting face is provided in the main body of the reaction container and contacted with a contact face of the lid so as to substantially shield the atmosphere. The groove opening to the fitting face of the main body is provided so that an appropriate amount of nitrogen-containing atmosphere can be supplied into the melt in the crucible. It is thereby possible to prevent the deformation of the reaction container by the pressure and the coloration of the single crystal due to oxygen. Further, according to the method, oxygen in the atmosphere is not absorbed by the oxygen absorbing material so as to prevent the coloration of the single crystal due to a trace amount of impurities generated from the oxygen-absorbing material.

Further, the atmosphere in the reaction container is substantially shielded so that the temperature uniformity can be effectively improved. By the improvement of temperature uniformity, it is possible to reduce heat shock onto the crucible due to the temperature change during the rise and drop of temperature to prevent the fracture of the crucible. Further, the atmosphere in the reaction container can be substantially shielded so that it is possible to reduce evaporation of flux.

Further, according to an embodiment of providing an outer container, in the outside of the reaction container, capable of holding the nitrogen-containing atmosphere and preventing the invasion of oxygen and water content, it is possible to effectively prevent influences such as oxidation of the raw materials due to oxygen or water content generated from a refractory material such as a heater unit or due to exposure to air during the charging in a furnace.

BEST MODES FOR CARRYING OUT THE INVENTION

Figure 1:
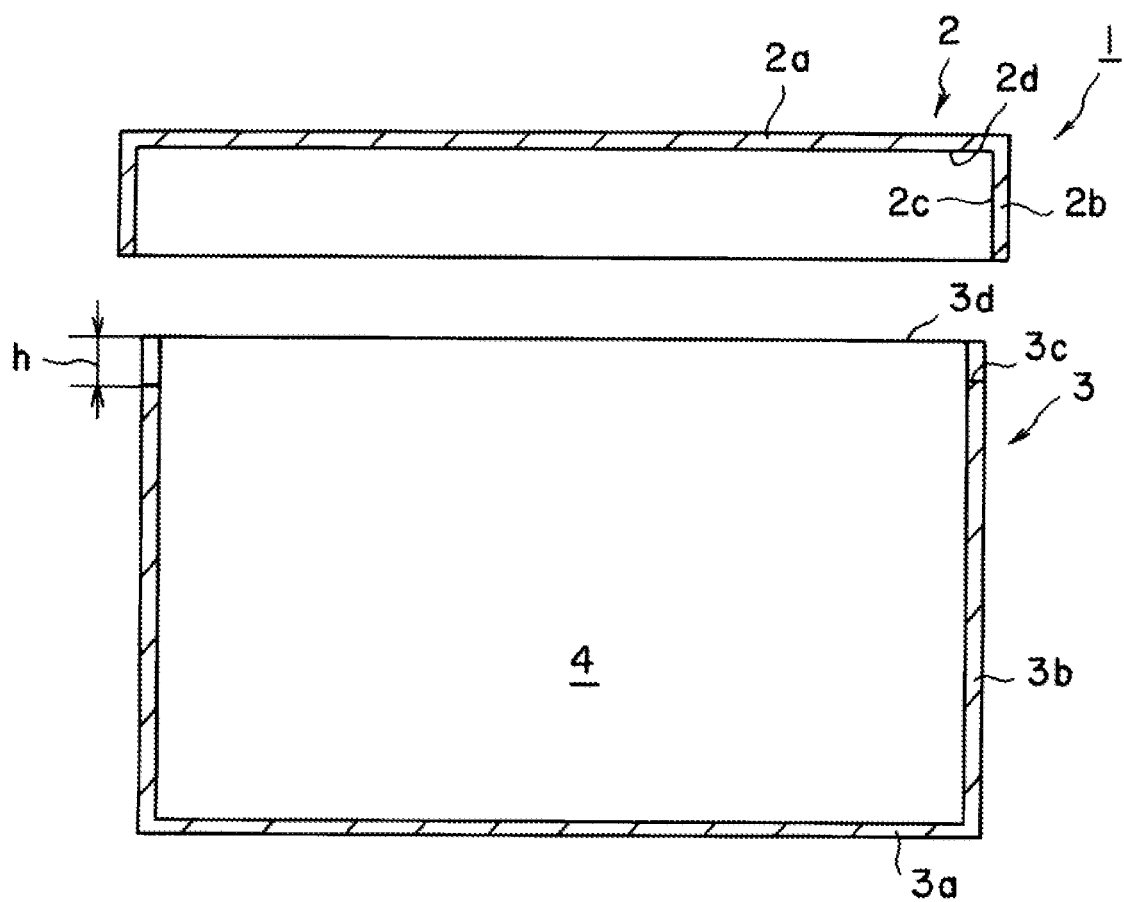
FIG. 1 is a cross sectional view showing a lid 2 and a main body 3 according to a preferred embodiment of the present invention.
Figure 2:
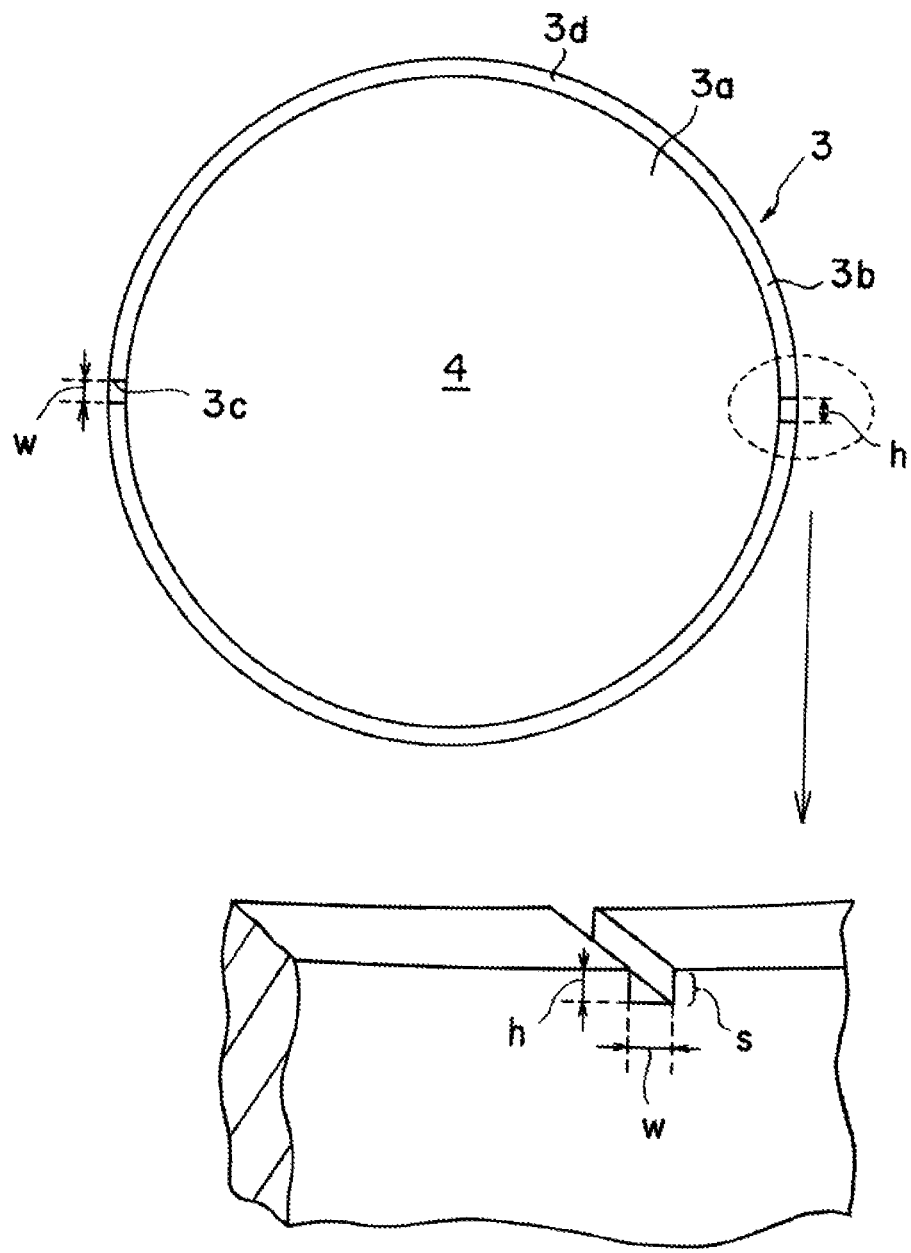
FIG. 2 is a plan view of the main body 3.
Figure 3:
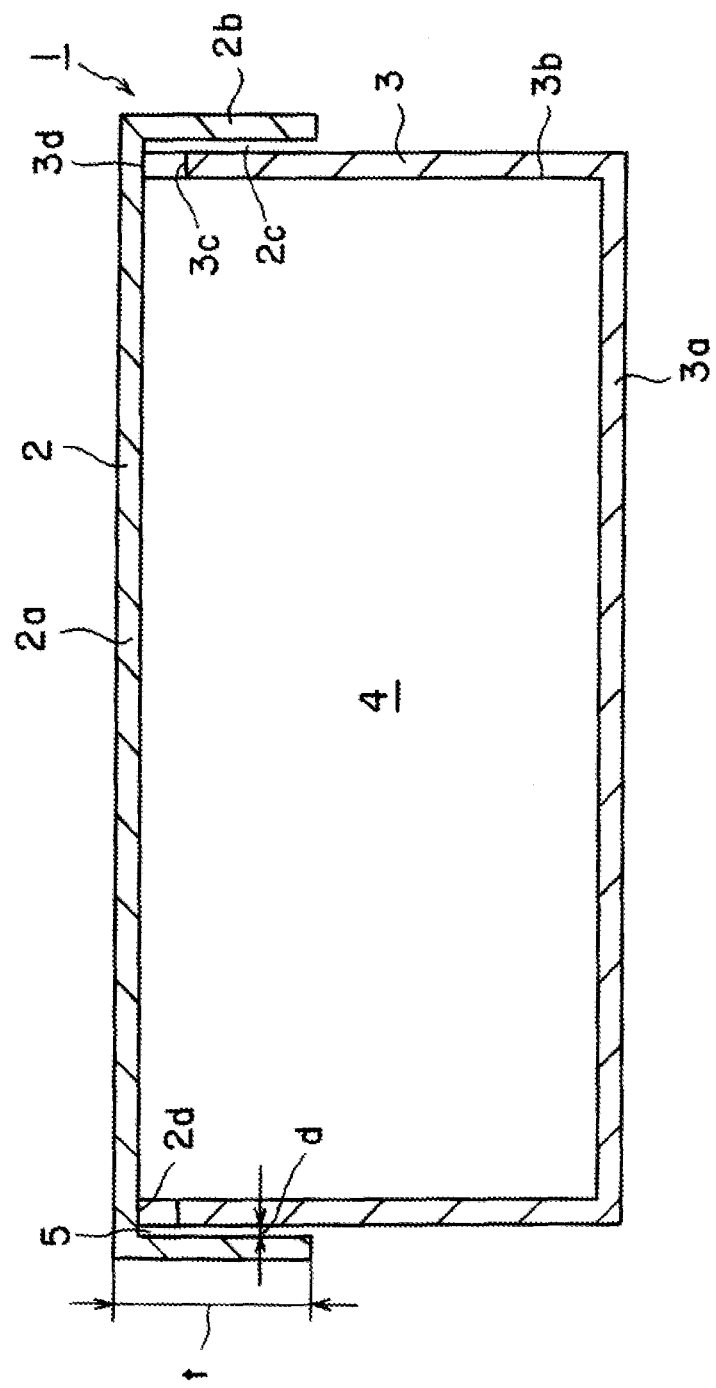
FIG. 3 is a cross sectional view showing a reaction container 1.

FIG. 1 is a cross sectional view showing a lid 2 and main body 3 according to a preferred embodiment of the present invention, FIG. 2 is a plan view of the main body 3, and FIG. 3 is a cross sectional view showing a reaction container 1.

The reaction container 1 is used for containing a crucible in its inner space 4 and for growing a single crystal of a nitride of group III metal. The lid 2 includes an upper plate part 2a and a flange part 2b protruding from an edge of the upper plate part 2a. 2d represents a contact face and 2c represents an inner wall face of the flange part 2b.

The main body 3 includes a bottom wall 3a and a side wall 3b, and a space 4 is formed inside of the side wall 3b. The side wall has an upper face functioning as a fitting face 3d. As shown in FIG. 2, a groove 3c is formed from the fitting face 3d toward the bottom wall. As shown in FIG. 3, the main body 3 is covered with the lid 2 so that the fitting face 3d is contacted with the contact face 2d and the side wall 3d is surrounded by the flange part 2b.

Figure 4:
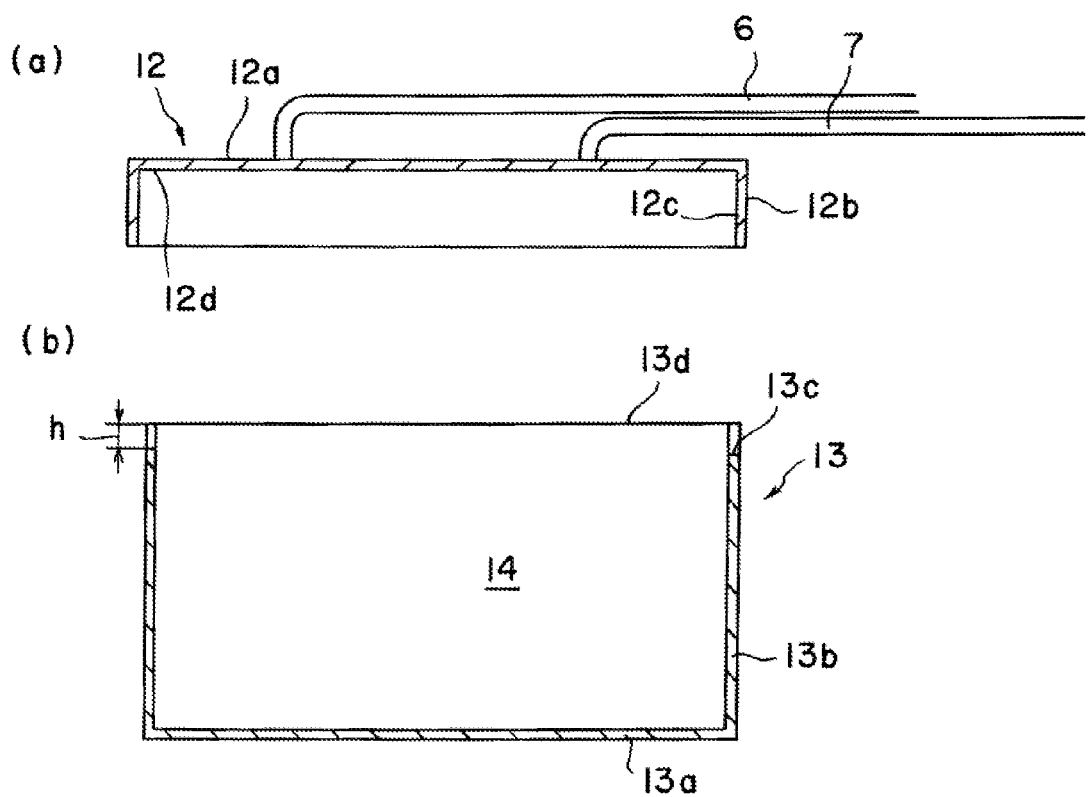
FIG. 4 is a cross sectional view showing a lid 12 and a main body 13 of an outer container.

Further, according to the present invention, the same construction as the reaction container may be applied to an outer container for containing the reaction container. FIG. 4 relates to such embodiment.

The outer container is used for containing the reaction container in its inner space 14 and for growing the single crystal of nitride of a metal belonging to group III of the Periodic Table. Its lid 12 includes an upper plate part 12a and a flange part 12b protruding from the edge of the upper plate part 12a. 12d represents a contact face and 12c represents an inner wall face of the flange part 12b. The upper plate part 12a of the lid 12 is equipped with a supply pipe 6 and discharge pipe 7 for nitrogen-containing atmosphere.

Figure 6:
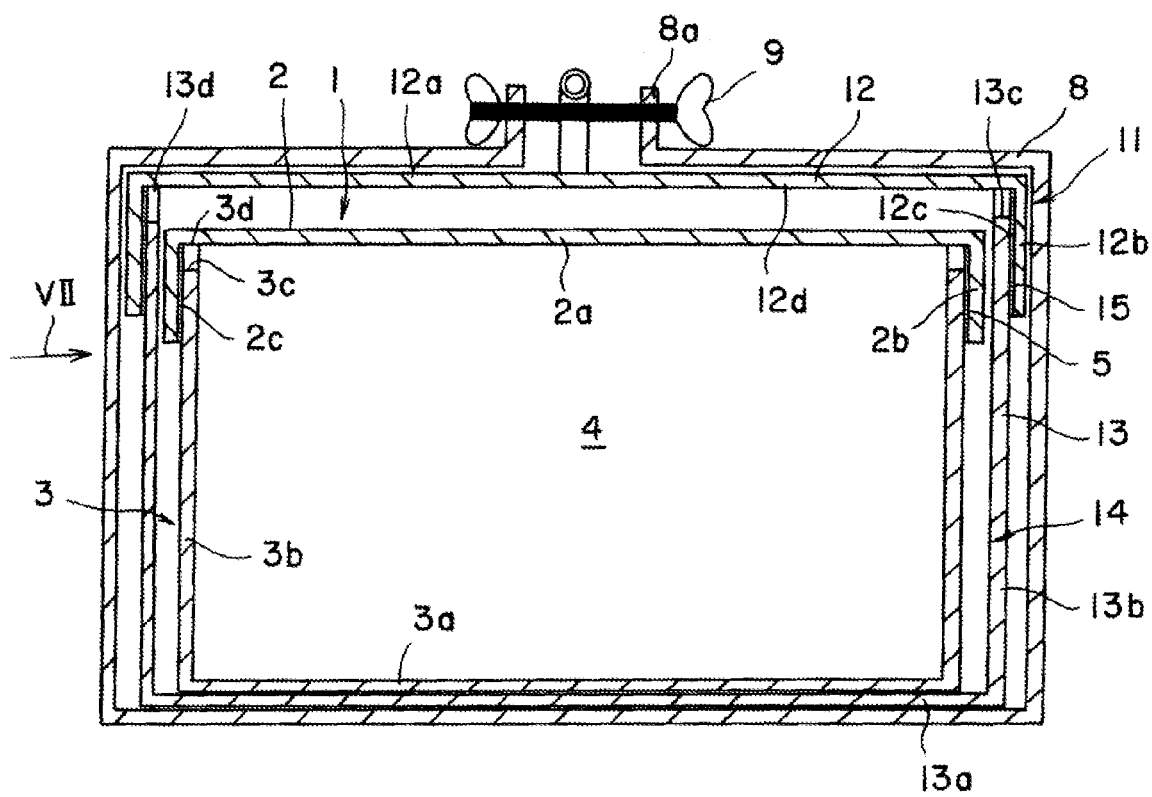
FIG. 6 is a cross sectional view showing the reaction container 1, outer container 11 and banding band 8.

A main body 13 includes a bottom wall 13a and a side wall 13b, and a space 14 is formed inside of the side wall 13b. The side wall 13b has an upper face providing a fitting face 13d. A groove 13c is formed from the fitting face 13d toward the bottom wall. As shown in FIG. 6, the lid 12 is fitted onto the main body 13 so that the fitting face 13d is contacted with the contact face 12d and the side wall 13 is surrounded by the flange part 12b to provide an outer container 11.

Figure 5:
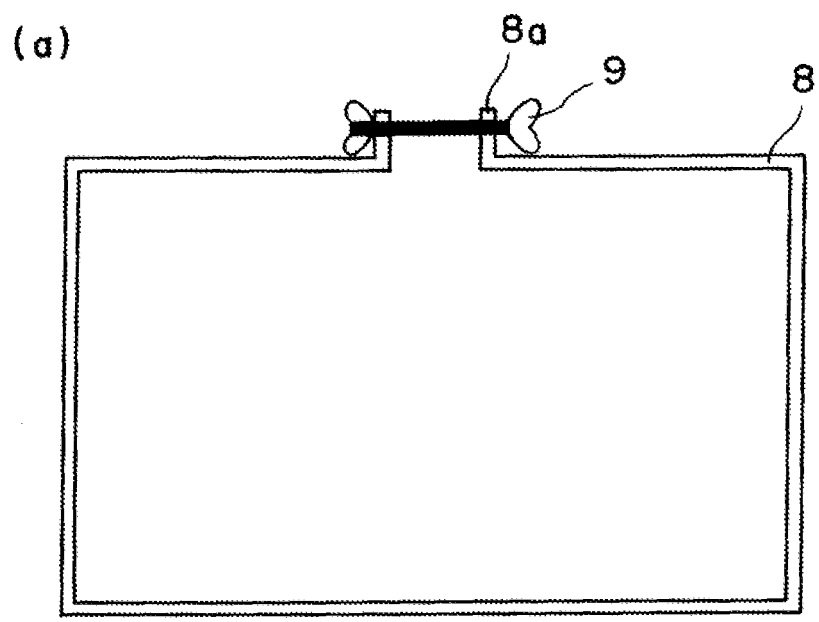
FIG. 5 (a) is a front view showing a banding band used for banding the lid and main body of the outer container, and FIG. 5 (b) is a side view showing the banding band 8.
Figure 5:
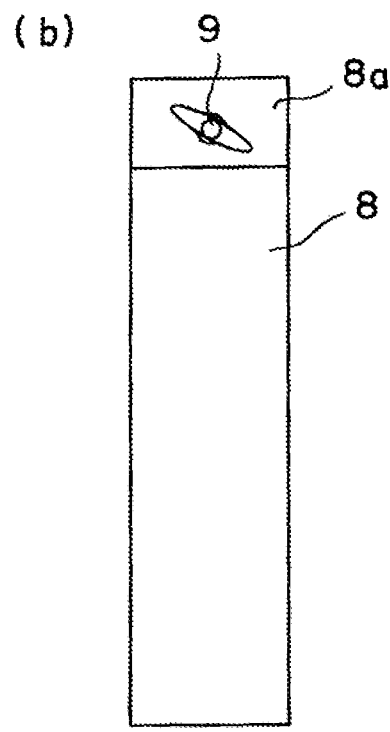

FIG. 5 (a) is a front view showing a banding band 8 used for banding the lid and main body of the outer container, and FIG. 5 (b) is a side view of the banding band 8. The banding band 8 is formed of an elongate band, and a pair of protrusions 8a is formed at both ends of the band. The opposing protrusions 8a are connected by means of a connecting member 9.

Figure 7:
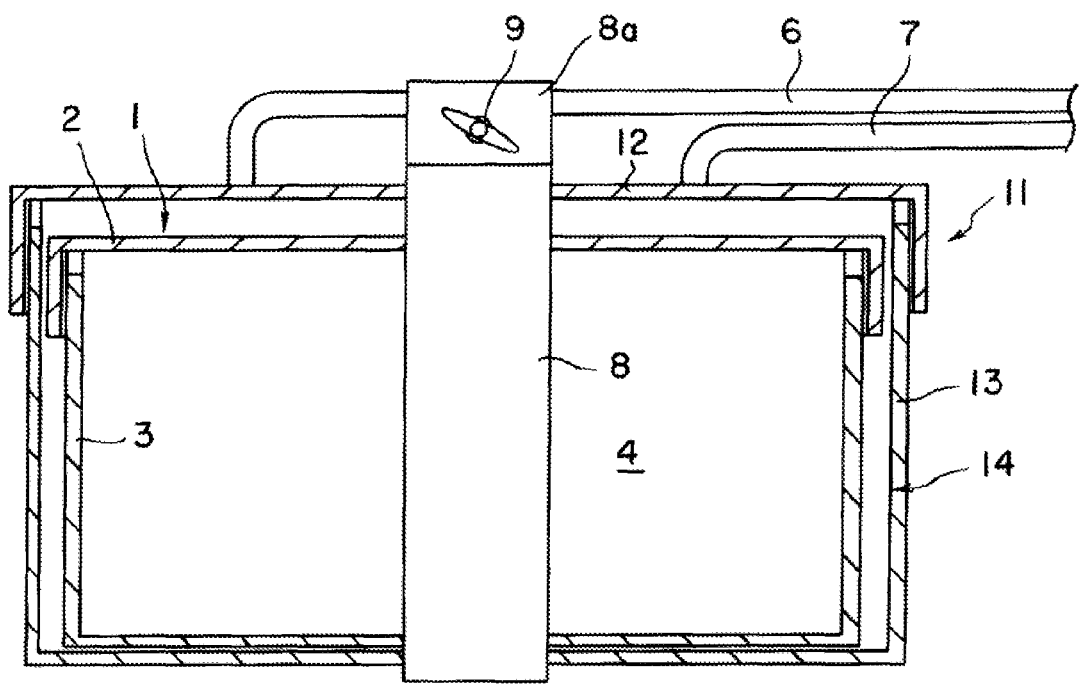
FIG. 7 is a cross sectional view showing FIG. 6 viewed along an arrow VII.
Figure 8:
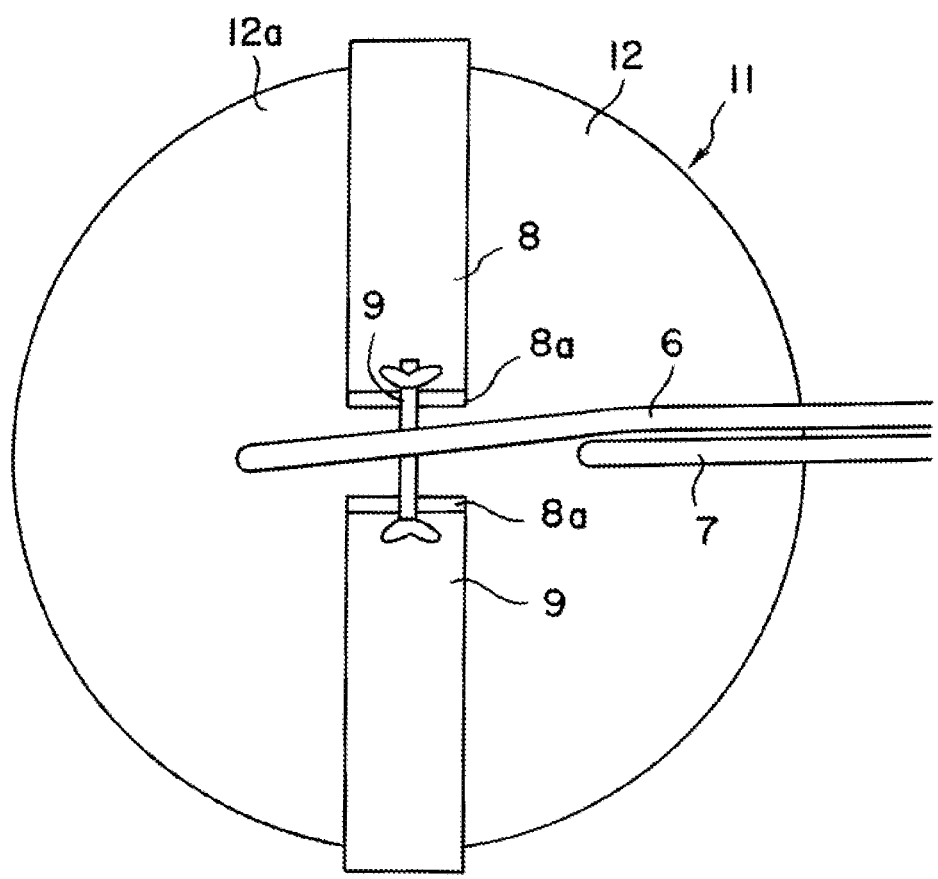
FIG. 8 is a plan view of FIG. 6.

FIG. 6 is a cross sectional view showing the reaction container, outer container and banding band, FIG. 7 is a cross sectional view showing these viewed in the direction of an arrow VII, and FIG. 8 is a plan view of FIG. 6. For the easiness of view, the crucible and melt are not shown.

Upon manufacturing, a predetermined raw material is contained in a crucible in a glove box, and the crucible is contained in a space 4 of a reaction container 1. Then, as shown in FIGS. 6, 7 and 8, the reaction container 1 is contained in a main body 13 of an outer container 11, and the main body 13 is covered with a lid 12. Then, the lid is banded with the banding band 8 with the main body of the outer container and banded with a connecting member 9.

Figure 9:
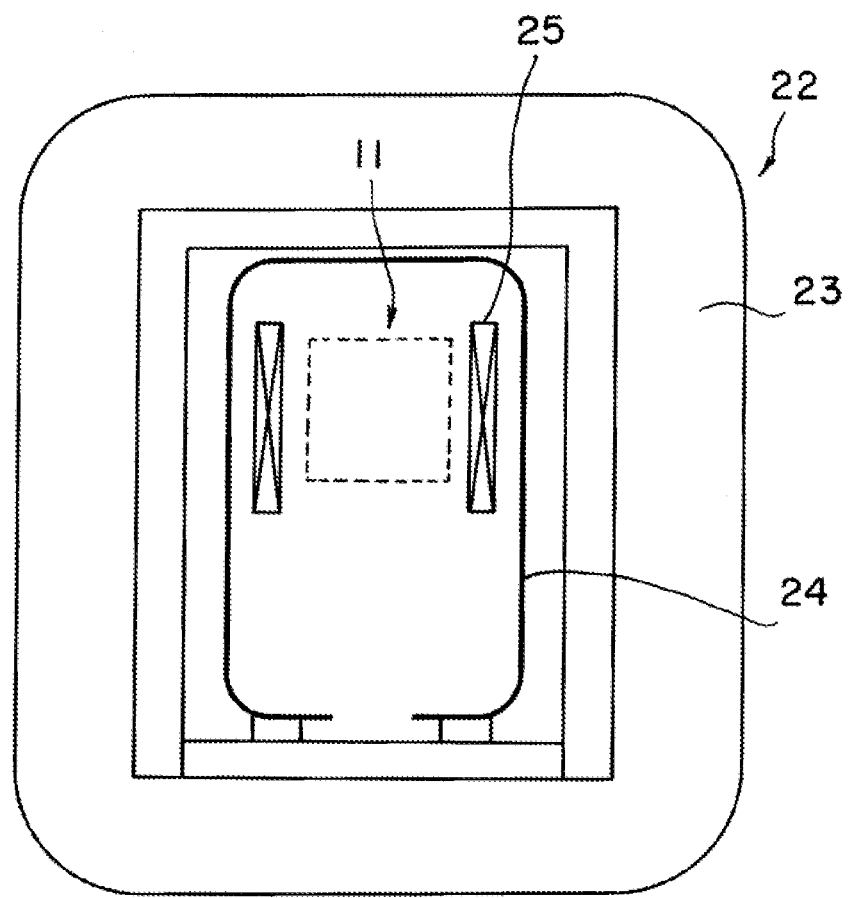
FIG. 9 is a view schematically showing a growing system 22.

During the growth, the reaction container, outer container and banding tool are contained in a pressure container equipped with pressurizing and heating mechanisms. For example in an example shown in FIG. 9, a jacket 24 is fixed in a pressure container 23 of an HIP (hot isostatic press) system 22, and the outer container 11 is set within the jacket 24. A gas bombe for mixing not shown is provided in the outside of the pressure container 23. Gas mixture of a predetermined composition is filled in the gas bombe, compressed by means of a compressor to a predetermined pressure and supplied into the outer container through the supply pipe 6. A heater 25 is provided around the outer container 11 so that the growth temperature can be controlled in the crucible.

Figure 10:
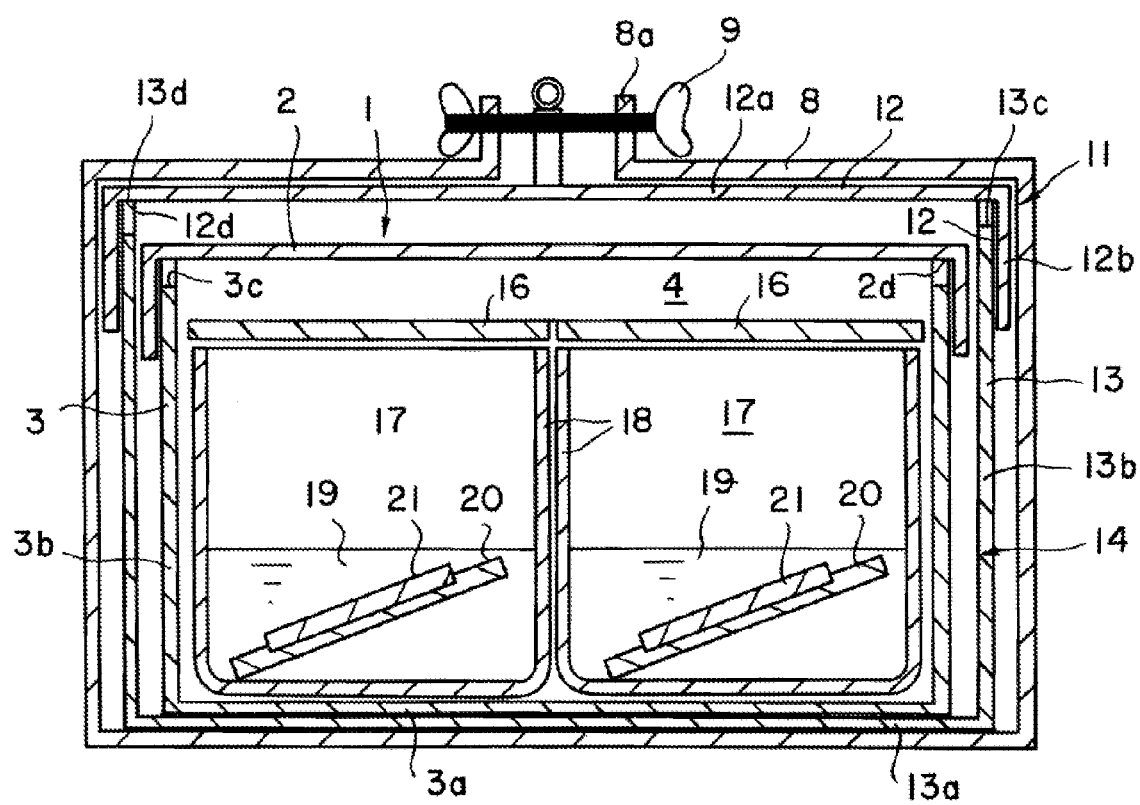
FIG. 10 is a cross sectional view showing the step of providing a crucible in the reaction container and of growing a single crystal.

During the growth, as shown in FIG. 10, a crucible 18 is provided in the reaction container 1, melt 19 is generated in the crucible 18, and a seed crystal 20 is immersed in the melt 19. A lid 16 is provided on the crucible 18. Atmosphere containing nitrogen is supplied into the inside of outer container 11 through the gas supply pipe 6. Nitrogen in this atmosphere provides a nitrogen source and inert gas such as argon gas functions to prevent the evaporation of the flux such as sodium. The pressure is monitored by means of a pressure gauge not shown.

As shown in FIGS. 2 and 3, the nitrogen-containing atmosphere supplied into the outer container passes through a spacing 5 between a flange part 2b of the reaction container 1 and main body 3 and through a groove 3c and then supplied into atmosphere 17 in the crucible. During the passage, an amount of the supplied atmosphere is controlled at an appropriate amount by both of the spacing 5 and groove 3c, so that the deformation of the reaction container, coloring of the single crystal and reduction of productivity can be prevented at the same time.

Besides, in the case that the flange part for forming the spacing is not provided, the coloring of the single crystal cannot be prevented even when the groove 3c is provided. Further, in the case that the groove is provided, it is proved that the coloring of the single crystal cannot be prevented when the groove is not opened at the fitting face 3d of the side wall of the main body and is provided inside of the side wall. That is, the spacing 5 is formed by the flange part so that the nitrogen-containing atmosphere flows upwardly in the spacing 5 and then flows downwardly from the groove provided at the upper edge of the main body 3. Such specific fine movement is proved to be important for preventing the coloring of the single crystal.

According to the present invention, as shown in FIG. 2, the groove is elongated between the outer and inner side faces of the side wall. Here, although the number of the groove may be one, it may preferably be plural so that it is easier to supply nitrogen to the whole of the melt uniformly. Although the upper limit of the number of the groove is not particularly limited, it may preferably be 4 or less.

The depth "h" of the groove may preferably be 0.1 mm to 2 mm and more preferably be 0.3 mm to 1.0 mm, on the viewpoint of the effects of the present invention. Further, the width "w" of the groove may preferably be 0.1 mm to 2 mm and more preferably be 0.3 mm to 1.0 mm, on the viewpoint of the effects of the present invention.

Further, provided that "s" is assigned to an area of a cross section of the groove, number of the groove(s)×s (total of areas of the groove(s)) may preferably be 0.2 to 50 mm$^2$ and more preferably be 1 to 10 mm$^2$, on the viewpoint of the effects of the present invention.

Dimensions "d" of the spacings 5 and 15 between the flange part and side wall (refer to FIGS. 3 and 6 may preferably be 0.5 mm or larger for facilitating the supply of nitrogen. Further, it may be 2.0 mm or smaller on the viewpoint of preventing the coloring due to oxygen in the melt.

The lengths "t" of the spacings 5, 15 between the flange part and side wall (refer to FIG. 3) may preferably be 50 mm or smaller, on the viewpoint of facilitating the supply of nitrogen. Further, it may preferably be 20 mm or larger on the viewpoint of preventing coloring due to oxygen in the melt.

An additional intermediate container may be provided between the above described reaction and outer containers to provide three-fold containers. The construction of the intermediate container may be same as that of the reaction container as described above, as far as the intermediate container has dimensions suitable for containing the reaction container. Further, the slit or flange part as described above is not indispensable in the outer container.

According to the present invention, it is possible to energize the reaction and outer containers toward the main body. The energizing means is not particularly limited, and may be a spring such as a metallic coil spring and plate spring. Otherwise, energizing means such as snap lock or weight may be used.

Although furnace materials for the heating mechanism are not particularly limited, it may be High-alumina refractory bricks (ISOLITE), (ISO-COR) (referred to as trade names), graphite refractory material (GRAFSGIELD (trade name) or hollow-sphere electro-fused alumina (alumina bubble).

Although materials for the heating element are not particularly limited, tantalum, SiC, SiC-coated graphite, nichrome, and Kanthal Super (trade name) may be listed.

The material of the crucible for performing the reaction is not particularly limited, and the crucible may be formed of an airtight material having durability under an intended heating and pressurizing condition. Examples of such material include high-melting point metals such as metallic tantalum, tungsten and molybdenum, oxides such as alumina, sapphire and yttria, nitride ceramics such as aluminum nitride, titanium nitride, zirconium nitride and boron nitride, carbides of high-melting point metals such as tungsten carbide and tantalum carbide, and thermal decomposition products such as p-BN (pyrolytic BN) and p-Gr (pyrolytic graphite).

Although materials for the reaction container and intermediate and outer containers are not particularly limited, stainless steel is preferred and SUS310S is most preferred. Although materials for the banding band is not limited, SUS 310S is preferred.

According to the present invention, the growth of the single crystal is performed in an atmosphere containing nitrogen. The nitrogenous atmosphere may be composed only of nitrogen, but may include a non-oxidizing gas other than nitrogen, for example, an inert gas such as argon or a reductive gas.

According to the present invention, a device for heating the raw material mixture to produce the melt in the single crystal growth apparatus is not particularly limited. Although a hot isostatic pressing apparatus is preferred as such device, other atmospheric pressurizing type heating furnaces are also usable.

The flux for producing the melt is not particularly limited, but it is preferably composed of one or more metals selected from the group consisting of alkali metals and alkali earth metals, or the alloys thereof. As such metals, sodium, lithium and calcium are particularly preferred, and sodium is most preferred.

As materials other than the flux and single crystal raw material to be added to the raw material mixture, following metals may be listed.

Potassium, rubidium, cesium, magnesium, strontium, barium, tin

As a dopant, a small amount of impurity element can be added. For example, silicon can be added as n-type dopant.

By the growing method according to the present invention, for example, the following single crystals can be suitably grown: GaN, AlN, InN, mixed crystal thereof (AlGaInN), and BN.

The heating temperature and pressure in the single crystal growing process are not particularly limited since they are selected depending on the kind of single crystal to be grown. The heating temperature may be set, for example, to 800 to 1500° C. The pressure is not particularly limited either, but is preferably set to 1 MPa or more, more preferably to 5 MPa or more. The upper limit of the pressure is not particularly regulated, but may be set, for example, to 200 MPa or less.

Further concrete single crystals and growing procedures thereof will be then described.

(Growth Example of Gallium Nitride Single Crystal)

The present invention can be used to grow gallium nitride single crystal using a flux containing at least sodium metal. A gallium raw material is mixed to the flux. As the gallium raw material, gallium single metal, a gallium alloy, and a gallium compound are applicable, and gallium single metal is suitably used from the viewpoint of handling.

The flux may include a metal other than sodium, for example, lithium. Although the gallium raw material and the flux raw material such as sodium may be used in an appropriate proportion, excess use of Na is generally considered. This is, of course, not limitative.

In this embodiment, the growth of gallium nitride single crystal is carried out under an atmosphere consisting of a mixed gas containing nitrogen gas at a total pressure ranging from 300 atm to 2000 atm. By setting the total pressure to 300 atm or more, gallium nitride single crystal of good quality could be grown, for example, in a high-temperature range of 900° C. or higher, more preferably in a high-temperature range of 950° C. or higher. This reason is not known exactly, but this is attributable to that the nitrogen solubility is increased according to temperature rise, and nitrogen efficiently dissolves in the growing solution. When the total pressure of the atmosphere is set to more than 2000 atm, the density of the high-pressure gas significantly gets close to that of the growing solution, so that it becomes difficult to retain the growing solution within the container for performing the reaction of the growing solution.

In a preferred embodiment, the nitrogen partial pressure in the atmosphere during growth is set to 100 atm or more and 2000 atm or less. By setting the nitrogen partial pressure to 100 atm or more, gallium nitride single crystal of good quality could be grown in a high-temperature range of, for example, 1000° C. or higher while promoting the dissolution of nitrogen to the flux. From this viewpoint, the nitrogen partial pressure is set more preferably to 200 atm or more. The nitrogen partial pressure is set also preferably to 1000 atm or less from the practical point of view.

Although gas other than nitrogen in the atmosphere is not particularly limited, an inert gas is preferred, and argon, helium or neon is particularly preferred. The partial pressure of the gas other than nitrogen corresponds to a value obtained by subtracting the nitrogen gas partial pressure from the total pressure.

In a preferred embodiment, the growth temperature of gallium nitride single crystal is set to 950° C. or higher, more preferably to 1000° C. or higher, and even in such a high-temperature range, gallium nitride single crystal of good quality may be grown. The growth at increased temperature and increased pressure can probably improve the productivity.

Although the upper limit of the growth temperature of gallium nitride single crystal is not particularly limited, an excessively high growth temperature makes the crystal growth difficult. Therefore, the growth temperature is set preferably to 1500° C. or lower. From this viewpoint, the temperature is set more preferably to 1200° C. or lower.

As the material of the growth substrate for epitaxially growing the gallium nitride crystal, sapphire, AlN template, GaN template, self-standing GaN substrate, silicon single crystal, SiC single crystal, MgO single crystal, spinel ($MgAl_2O_4$), and perovskite composite oxide such as $LiAlO_2$, $LiGaO_2$, $LaAlO_3$, $LaGaO_3$ or $NdGaO_3$ can be given although it is not particularly limited thereto. A cubic perovskite composite oxide represented by the composition formula $[A_{1-y}(Sr_{1-x}Ba_x)_y][(Al_{1-z}Ga_z)_{1-u}Du]O_3$ (wherein A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable. Further, SCAM ($ScAlMgO_4$) is also usable.

(Growth Example of AlN Single Crystal)

The present invention could be confirmed to be effective for growth of AlN single crystal by pressurizing a melt including a flux containing at least aluminum and alkali earth metal in a specific condition under a nitrogen gas containing atmosphere.

EXAMPLES

Example 1

In a glove box maintained at a dew point of −90° C. or lower and an oxygen content of 0.5 ppm or less, 45 g of metal sodium, 30 g of metal gallium, 0.1 g of carbon and a GaN template with a diameter of 2 inch were charged in an alumina crucible 18 having an inner diameter of 6 cm. The GaN template was composed of a sapphire substrate and a thin film of GaN single crystal and a thickness of 10 μm grown by vapor phase process. Three samples were prepared each having the GaN template contained in the alumina crucible and positioned in the reaction container 1 (inner diameter of 160 mm) made of stainless steel shown in FIGS. 1 to 3. Two slits 3c were formed in the reaction container. The slit 3c had a depth "h" of 0.5 mm and a width "w" of 1.0 mm, and total "2S" of areas of the slits was 1.0 mm². The width "d" of the spacing 5 was 1.0 mm.

The reaction container 1 was contained in the outer container 11 and fixed by a banding band made of stainless steel so that the lid did not open. Two slits 13c were formed in the outer container 11. The slit 13c had a height "h" of 0.5 mm and a width "w" of 1.0 mm, and total "2S" of areas of the slits was 1.0 mm². The width "d" of the spacing 15 was 1.0 mm.

The outer container 11 was drawn out of the glove box and then placed inside of the pressure container of a growing system. Then, the inside of the pressure container was exposed to air (for about 6 minutes) before the pressure container was closed with a lid and vacuum suction was started. Besides, the outer container was equipped with supply and discharge pipes, each of which was equipped with a stop valve. The stop valve was utilized so that "close" was assigned in the glove box and "open" was assigned direct before the lid of the pressure container was closed. The vacuum suction was continued for about 30 minutes (at a vacuum degree of about 0.1 Pa). Thereafter, nitrogen gas was supplied to a growth pressure (about 4 MPa). After the pressurizing, the temperature was raised to the growth temperature over about 2 hours. After the temperature was maintained at the growth temperature, nitrogen gas was flown into the outer container at a flow rate of 200 sccm until the completion of the growth.

After the growth temperature was maintained for 120 hours, it was cooled to 200° C. over 5 hours. The pressure in the furnace was gradually lowered to 0.2 MPa over about 2 hours at 200° C., and it was then cooled to room temperature. The pressure was lowered at 200° C. for preventing the fracture which might be caused by that the slit of the outer container was sealed with vaporized metal sodium to inhibit the escape of the inner pressure. It is considered that the fracture of the container should be avoided at a temperature higher than 98° C., the melting point of sodium metal. However, the inner gas was discharged at 200° C. so that the gas could be certainly escaped through the slit of the outer container to make the pressures in the outer and reaction containers equal to that in the furnace. After the pressure in the furnace was lowered to atmospheric pressure, the lid of the pressure container was opened, and the outer container was drawn out and transferred into the glove box. The crucible in the reaction container was drawn out to observe that the melt showed metallic luster.

It was thus confirmed that the oxidation of the raw material could be prevented. Further, cracks were not observed in the crucible. The total weight was measured before the crucible was drawn out of the reaction container to prove that the weight was increased by an amount of the nitriding of the raw material. The amount of the vaporized flux was calculated from a difference of the amount of weight gain and the weight of the grown crystal to prove that the amount of the vaporized flux was small, that is, less than 0.5 weight percent. On the other hand, it was observed the evaporation of the flux through the spacing of the crucible lid and crucible and the adherence of liquid drops on the inside of the reaction container. The liquid drops were collected and the weight was measured to prove that the amount of vaporized flux was about 1 weight percent of the charged weight.

The flux was removed and the grown GaN single crystal was collected to prove that it was grown to about 2 mm and had hexagonal shape having a diameter of slightly larger than 5 cm. The half-value widths of X-ray diffraction rocking curve of the crystal at (0002) and (10-12) reflections were proved to be about 50 seconds and 60 seconds, respectively.

The transmittance of the polished crystal was measured in visual to ultraviolet bands to prove that absorption was not substantially observed to the terminal of the band (364 nm). The crystal was colorless and transparent. The amounts of impurities were measured by SIMS analysis to prove that the oxygen content was $5 \times 10^{16}$ atoms/cm$^3$.

Example 2

An additional intermediate container may be provided between to above described reaction and outer containers to provide three-fold containers. The crucible, GaN single crystal and flux materials were charged in the innermost reaction container. GaN single crystal was grown according to the same procedure as the Example 1 except the above modifications. After the growth, the container was transferred into the glove box and held to room temperature. The crucible was then drawn out to prove that the surface of the materials in the crucible maintained its metallic luster. It was thus proved that the oxidation of the raw material could be prevented. Further, cracks were not observed in the crucible.

The flux was removed and the grown GaN single crystal was collected to prove that it was grown to about 2 mm and had hexagonal shape having a diameter of slightly larger than 5 cm. The crystal was colorless and transparent. The half-value widths of X-ray diffraction rocking curve of the crystal at (0002) and (10-12) reflections were proved to be about 50 seconds and 60 seconds, respectively. The transmittance of the polished crystal was measured in visual to ultraviolet bands and was proved to be 75 to 80 percent. Considering Fresnel reflection loss, absorption was not substantially observed to the terminal of the band (364 nm). The amounts of impurities were measured by SIMS analysis to prove that the oxygen content was $5 \times 10^{16}$ atoms/cm$^3$. According to the above results, it was proved that the quality and impurity contents were not changed in the case that the intermediate container was provided between the reaction and outer containers to provide the three-fold containers.

Example 3

GaN single crystal was grown according to the same procedure as the Example 1. However, the slits 13c were not formed in the outer container. After the growth, the container was transferred into the glove box and the crucible was drawn out to prove that the crucible maintained its metallic luster.

The flux was removed and the grown GaN single crystal was collected to prove that it was grown to about 2 mm and had hexagonal shape having a diameter of slightly larger than 5 cm. The half-value widths of X-ray diffraction rocking curve of the crystal at (0002) and (10-12) reflections were proved to be about 50 seconds and 60 seconds, respectively. The transmittance of the polished crystal was measured in visual to ultraviolet bands and was proved that absorption was not substantially observed in the band width (to 364 nm). The crystal was colorless and transparent. The amounts of impurities were measured by SIMS analysis to prove that the oxygen content was $5 \times 10^{16}$ atoms/cm$^3$.

Comparative Example 1

The experiment was performed according to the same procedure as the Example 1, except that the crucible was contained in the outer container without using the reaction container described above. As a result, the crucible was drawn out of the glove box to prove that its surface was oxidized and turned to turbid. A plenty of undesirable crystals with a size of several mm were generated due to natural nucleation on the inner wall surface of the crucible. It was thus proved that the temperature distribution was not uniform and the atmosphere during the growth was contaminated with oxygen or water content.

The flux was removed and the grown GaN single crystal was collected to prove that it was grown to about 1 mm and had hexagonal shape having a diameter of slightly larger than 5 cm. The half-value widths of X-ray diffraction rocking curve of the crystal at (0002) and (10-12) reflections were proved to be about 150 seconds and 200 seconds, respectively. And each reflection corresponded to several peaks instead of a single peak. The transmittance of the polished crystal was measured in visual to ultraviolet bands and was proved that transmittance was 50 percent or less in band width (364 nm). The crystal was transparent and black looking like a kind of a sunglass. The amounts of impurities were measured by SIMS analysis to prove that the oxygen content was $5 \times 10^{18}$ atoms/cm$^3$, which was proved to be higher than that in the Example 1. Further, metal sodium was detected.

Further, cracks were frequently observed in the crucibles.

Comparative Example 2

GaN single crystal was grown according to the same procedure as the Example 1, except that the slits were not formed in the reaction and outer containers. The outer container was drawn out of the growing furnace to observe that the container main body was dented inwardly. Further, both of the lid and main body of the reaction container were considerably dented so that the lid could not be opened. The crucible in the reaction container was fractured into powder.

Comparative Example 3

GaN single crystal was grown according to the same procedure as the Example 1, except that the slits of the reaction and outer containers are not opened to the fitting faces of the main bodies so that round holes of φ1 were formed under the fitting faces at a distance of 20 mm, respectively. After the completion of growth, the container was transferred into the glove box and the crucible was drawn out to prove that the crucible maintained its metallic luster.

The flux was removed and the grown GaN single crystal was collected to prove that it was grown to about 1.5 mm. The crystal includes a black region of 0.3 mm thick initially grown and subsequently grown region which was colorless and transparent. The transparent region of the crystal was polished and its transmittance was measured in visual to ultraviolet bands to prove that transmittance was 75 to 80 percent in band width (364 nm). Absorption was hardly observed considering Fresnel reflection loss. The amounts of impurities were measured by SIMS analysis to prove that the oxygen content was $2 \times 10^{17}$ atoms/cm$^3$. The black region was subjected to EPMA analysis to detect orders of several hundreds ppm of oxygen and sodium. The half-value widths of X-ray diffraction rocking curve of the polished crystal of the transparent region at (0002) and (10-12) reflections were measured and proved to be about 120 seconds and 150 seconds, respectively. The half-value widths of X-ray diffraction rocking curve of the polished crystal of the black region at (0002) and (10-12) reflections were measured and proved to be about 300 seconds and 500 seconds, respectively.

Comparative Example 4

GaN single crystal was grown according to the same procedure as the Example 1, except that the flange part was not provided in the lid of the reaction container. After the completion of growth, the container was transferred into the glove box and the crucible was drawn out to prove that the crucible maintained its metallic luster.

The flux was removed and the grown GaN single crystal was collected to prove that it was grown to about 1.5 mm. The crystal includes a black region of 0.3 mm thick initially grown and subsequent grown region which was colorless and transparent. The transparent region of the crystal was polished and its transmittance was measured in visual to ultraviolet bands to prove that transmittance was 75 to 80 percent in the band width (364 nm). Several percent of absorption was observed considering Fresnel reflection loss. Further, regions (inclusion) incorporating the flux were observed everywhere in the crystal. The half-value widths of X-ray diffraction rocking curve of the crystal at (0002) and (10-12) reflections were proved to be about 150 seconds and 200 seconds, respectively. And each reflection corresponded to several peaks instead of a single peak. The amounts of impurities of the transparent region were measured by SIMS analysis to prove that the oxygen content was $2 \times 10^{17}$ atoms/cm$^3$. The black region was subjected to EPMA analysis to detect orders of several hundreds ppm of oxygen and sodium. The half-value widths of X-ray diffraction rocking curve of the polished crystal of the transparent region at (0002) and (10-12) reflections were measured and proved to be about 120 seconds and 150 seconds, respectively. The half-value widths of X-ray diffraction rocking curve of the polished crystal of the black region at (0002) and (10-12) reflections were measured and proved to be about 300 seconds and 500 seconds, respectively.

While specific preferred embodiments have been shown and described, the present invention is never limited by these specific embodiments, and can be carried out with various modifications and substitutions without departing from the spirit and scope of the claims of the present invention.

DESCRIPTION OF REFERENCE NUMERALS

1: Reaction container, 2, 12: Lid, 2a, 12a: Upper plate part, 2b, 12b: Flange part, 2c, 12c: Inner wall surface of the flange part, 2d, 12d: Contact face of upper plate part, 3, 13: Main body 3a, 13a: Bottom wall, 3b, 13b: Side wall, 3c, 13c: Recess 3d, 13d: Fitting face, 4, 14: Space, 5: Spacing 8: Banding band, 11: Outer container, 18: Crucible 19: Melt, 20: Single crystal substrate, 21: Nitride single crystal H: Depth of recess, w: Width of recess, s: Area of recess T: Length of spacing 5

The invention claimed is:

1. A reaction container used for growing a nitride single crystal of a metal belonging to III group by charging raw materials of a nitride single crystal of a metal belonging to III group and a flux in a crucible; containing said crucible in a reaction container; containing said reaction container in an outer container; containing said outer container in a pressure container; and generating a melt in said crucible while supplying an atmospheric gas containing nitrogen into said outer container to grow said nitride single crystal;
wherein said reaction container comprises a main body containing said crucible and a lid mounted on said main body;
wherein said main body comprises a bottom wall and a side wall comprising a fitting face and a groove opening at said fitting face so that the atmospheric gas is supplied into the crucible through the groove; and
wherein said lid comprises an upper plate part comprising a contact face contacting said fitting face and a flange part extending from said upper plate part and surrounding an outer side of said side wall.

2. The reaction container of claim 1, wherein a plurality of said grooves are formed in said side wall.

3. The reaction container of claim 1, wherein said side wall and said flange part is distant by 0.5 to 2.0 mm.

4. A method of growing the nitride single crystal of a metal belonging to III group using the reaction container of claim 1, the method comprising:
charging materials of a nitride single crystal of a metal belonging to III group and a flux in a crucible;
containing said crucible in a reaction container; containing said reaction container in an outer container; containing said outer container in a pressure container; and
generating a melt in said crucible while supplying an atmospheric gas containing nitrogen into said outer container to grow said nitride single crystal of a metal belonging to III group;
wherein said reaction container comprises a main body containing said crucible and a lid mounted on said main body;
wherein said main body comprises a bottom wall and a side wall comprising a fitting face and a groove opening at said fitting face; and
wherein said lid comprises an upper plate part comprising a contact face contacting said fitting face and a flange part extending from said upper plate part and surrounding an outer side of said side wall.

5. The method of claim 4, wherein a plurality of said grooves are formed in said side wall.

6. The method of claim 4, wherein said side wall and said flange part is distant by 0.5 to 2.0 mm.

7. The method of claim 5, wherein said side wall and said flange part is distant by 0.5 to 2.0 mm.

8. The method of claim 4, wherein said outer container comprises a main body containing said reaction container and a lid mounted on said main body; wherein said main body comprises a bottom wall and a side wall comprising a fitting face and a groove opening at said fitting face; and wherein said lid comprises an upper plate part comprising a contact face contacting said fitting face and a flange part extending from said upper plate part and surrounding an outer side of said side wall.

9. The method of claim 5, wherein said outer container comprises a main body containing said reaction container and a lid mounted on said main body; wherein said main body comprises a bottom wall and a side wall comprising a fitting face and a groove opening at said fitting face; and wherein said lid comprises an upper plate part comprising a contact face contacting said fitting face and a flange part extending from said upper plate part and surrounding an outer side of said side wall.

10. The method of claim 6, wherein said outer container comprises a main body containing said reaction container and a lid mounted on said main body; wherein said main body comprises a bottom wall and a side wall comprising a fitting face and a groove opening at said fitting face; and wherein said lid comprises an upper plate part comprising a contact face contacting said fitting face and a flange part extending from said upper plate part and surrounding an outer side of said side wall.

11. The method of claim 4, wherein said lid and main body of said outer container are banded with a banding band in growing said nitride single crystal of a metal belonging to the III group.

12. The method of claim 5, wherein said lid and main body of said outer container are banded with a banding band in growing said nitride single crystal of a metal belonging to the III group.

13. The method of claim 6, wherein said lid and main body of said outer container are banded with a banding band in growing said nitride single crystal of a metal belonging to the III group.

14. The method of claim 8, wherein said lid and main body of said outer container are banded with a banding band in growing said nitride single crystal of a metal belonging to the III group.

15. The reaction container of claim 1, wherein the reaction container further comprises a spacing between the flange part and the main body so that the atmospheric gas is supplied into the crucible both through the groove opening and the spacing.

16. A system of growing a nitride single crystal of a metal belonging to III group, the system comprising:
- a reaction container for containing a crucible charged by materials of a nitride single crystal of a metal belonging to III group and a flux;
- an outer container for containing said reaction container;
- a pressure container for containing said outer container; and
- a system for supplying an atmospheric gas containing nitrogen into said outer container;
- wherein said reaction container comprises a main body containing said crucible and a lid mounted on said main body;
- wherein said main body comprises a bottom wall and a side wall comprising a fitting face and a groove opening at said fitting face so that the atmospheric gas is supplied into the crucible through the groove; and
- wherein said lid comprises an upper plate part comprising a contact face contacting said fitting face and a flange part extending from said upper plate part and surrounding an outer side of said side wall.

17. The system of claim 16, wherein a plurality of said grooves are formed in said side wall.

18. The system of claim 16, wherein said side wall and said flange part is distant by 0.5 to 2.0 mm.

19. The system of claim 16, wherein said outer container comprises a main body containing said reaction container and a lid mounted on said main body; wherein said main body comprises a bottom wall and a side wall comprising a fitting face and a groove opening at said fitting face; and wherein said lid comprises an upper plate part comprising a contact face contacting said fitting face and a flange part extending from said upper plate part and surrounding an outer side of said side wall.

20. The system of claim 16, wherein said lid and main body of said outer container are banded with a banding band.

21. A method of growing a nitride single crystal of a metal belonging to III group by using the system of claim 16, the method comprising:
- charging materials of a nitride single crystal of a metal belonging to III group and a flux in a crucible;
- containing said crucible in a reaction container;
- containing said reaction container in an outer container;
- containing said outer container in a pressure container; and
- generating a melt in said crucible while supplying an atmospheric gas containing nitrogen into said outer container to grow said nitride single crystal of a metal belonging to III group.

22. The system of claim 16, wherein the reaction container further comprises a spacing between the flange part and the main body so that the atmospheric gas is supplied into the crucible both through the groove opening and the spacing.

* * * * *